(12) United States Patent
Kawamura

(10) Patent No.: US 8,078,950 B2
(45) Date of Patent: Dec. 13, 2011

(54) DELAY MEASURING DEVICE AND SEMICONDUCTOR DEVICE

(75) Inventor: Makoto Kawamura, Osaka (JP)

(73) Assignee: Panasonic Corporation, Osaka (JP)

( * ) Notice: Subject to any disclaimer, the term of this patent is extended or adjusted under 35 U.S.C. 154(b) by 869 days.

(21) Appl. No.: 12/127,369

(22) Filed: May 27, 2008

(65) Prior Publication Data

US 2008/0303544 A1    Dec. 11, 2008

(30) Foreign Application Priority Data

Jun. 7, 2007  (JP) ................................. 2007-151388

(51) Int. Cl.
*G06F 11/00*    (2006.01)
(52) U.S. Cl. ...................................... 714/815; 714/814
(58) Field of Classification Search .................. 327/269, 327/284; 369/47.31; 365/194; 375/226; 714/815, 814
See application file for complete search history.

(56) References Cited

U.S. PATENT DOCUMENTS

| | | | | |
|---|---|---|---|---|
| 5,049,766 A | * | 9/1991 | van Driest et al. ............ | 327/269 |
| 5,233,590 A | * | 8/1993 | Ogawa ........................ | 369/47.31 |
| 6,477,115 B1 | | 11/2002 | Inoshita et al. | |
| 7,173,468 B2 | * | 2/2007 | Collins et al. ................. | 327/284 |
| 7,889,581 B2 | * | 2/2011 | Wakasa ......................... | 365/194 |
| 2003/0034795 A1 | | 2/2003 | Otto et al. | |
| 2005/0111537 A1 | * | 5/2005 | Sunter et al. .................. | 375/226 |

FOREIGN PATENT DOCUMENTS

JP    2005-322860    11/2005

* cited by examiner

*Primary Examiner* — David Ton
(74) *Attorney, Agent, or Firm* — McDermott Will & Emery LLP

(57) ABSTRACT

A delay measuring device according to the present invention comprises a memory cell, a delay element and a selector. The memory cell is provided with a non-inversion output terminal and an inversion output terminal, and the memory cell fetches a data value inputted from outside in synchronization with a clock, retains the fetched data value and outputs the retained data value from the non-inversion output terminal and the inversion output terminal. The delay element is connected to the inversion output terminal. The selector selects one of the data value and a delayed data value outputted from the delay element and supplies the selected data value to the memory cell. In the present invention, a comparison result of making a comparison between a delay amount generated in the delayed data value and a time length defined based on the clock is outputted from the non-inversion output terminal.

15 Claims, 8 Drawing Sheets

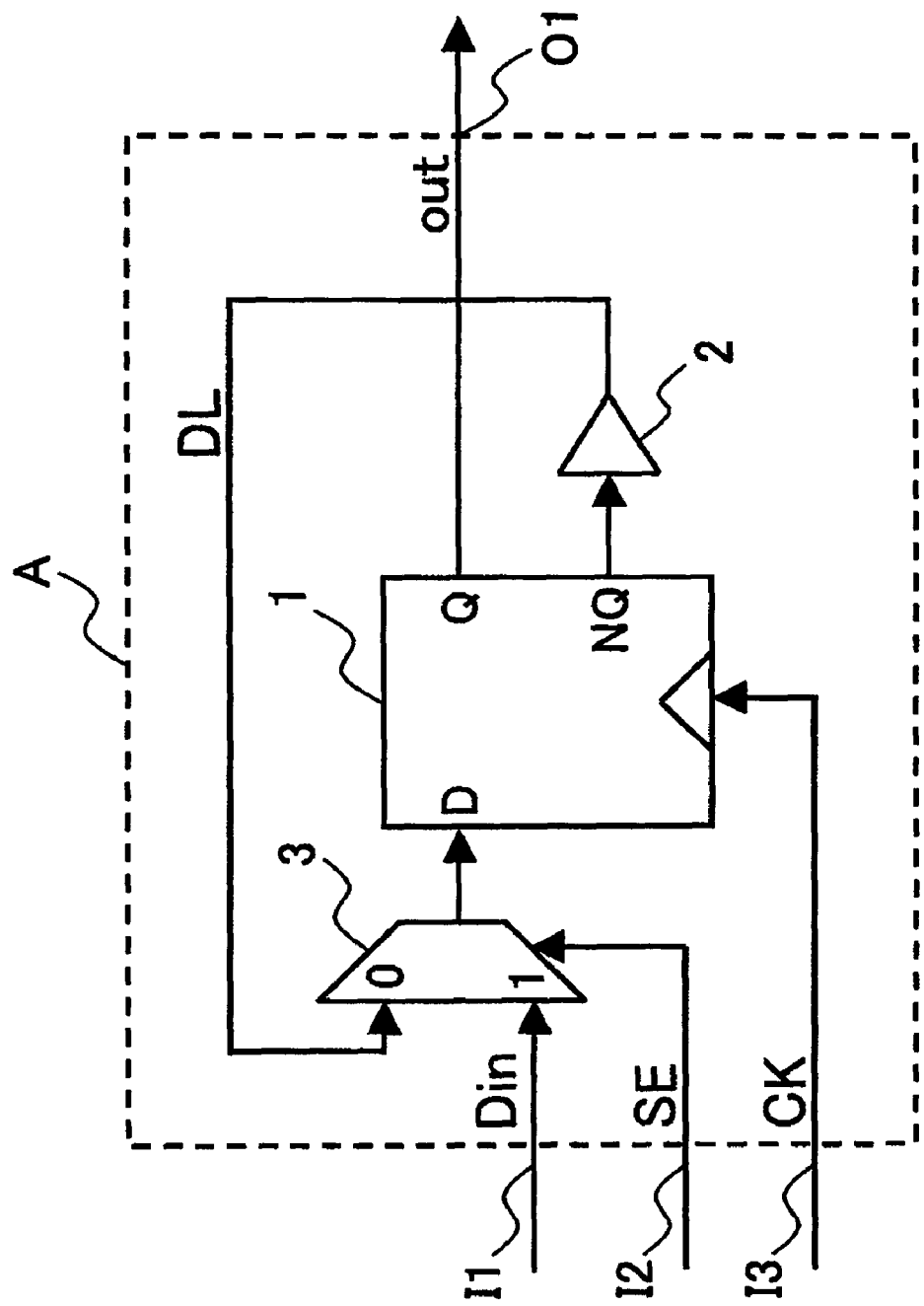
F I G. 1

F I G. 7
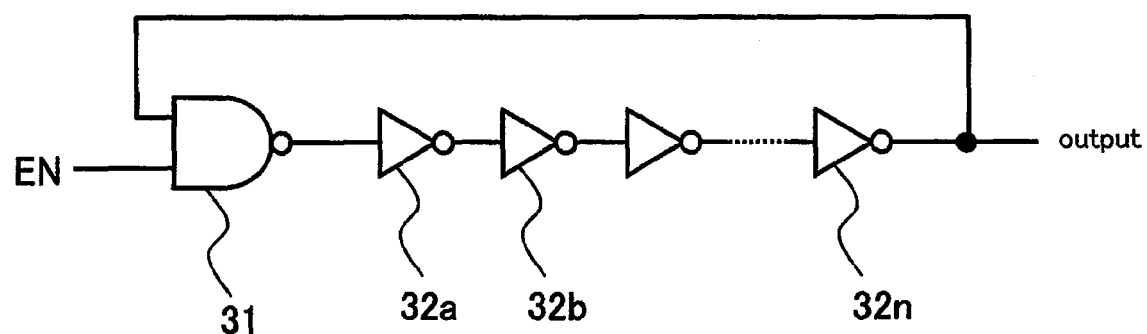

us 8,078,950 B2

DELAY MEASURING DEVICE AND SEMICONDUCTOR DEVICE

BACKGROUND OF THE INVENTION

1. Field of the Invention

The present invention relates to a delay measuring device mainly for measuring a delay amount in a semiconductor device.

2. Description of the Related Art

As a semiconductor integrated circuit has an increasingly larger capacity in recent years, the variability of characteristics in one semiconductor chip is increasingly notable. As a result, it becomes increasingly necessary to accurately grasp a delay amount generated in a semiconductor chip in order to manufacture a semiconductor device having a high quality.

However, when the delay amount is measured at a plurality of positions inside the semiconductor chip according to the conventional technology, it is necessary to provide a significantly large number of wiring lines in a delay measuring device, which unfavorably increases a circuit area. In order to reduce the circuit area, it is necessary to reduce the number of the positions where the delay amount is to be measured.

Below is described a conventional delay measuring device recited in No. 2005-322860 of the Japanese Patent Applications Laid-Open. FIG. 7 is a circuit diagram illustrating a first constitution of the conventional delay measuring device. The delay measuring device comprises a two-input NAND gate 31 and an even number of inverters 32a, 32b, ..., 32n which are cascade-connected to an output of the NAND gate 31. An output of the rearmost inverter 32n is fed back to one of the two input terminals of the NAND gate 31, and the inverters 32a, 32b, ..., 32n constitute a ring oscillator. Due to delay characteristics of the inverters 32a, 32b, ..., 32n, the ring oscillator outputs a clock having a frequency conformable to the variation of the delay amount.

FIG. 8 is a circuit diagram illustrating a second constitution of the conventional delay measuring device. The delay measuring device comprises a plurality of buffers 41a, 41b, ..., 41n cascade-connected to one another, flip-flops 42a, 42b, ..., 42n, and a decoder 43. Outputs of the buffers 41a, 41b, ..., 41n are respectively connected to data inputs (D) of the flip-flops 42a, 42b, ..., 42n corresponding thereto, clock terminals of the flip-flops 42a, 42b, ..., 42n are connected to a common supply wire of a clock CK, and Q outputs of the flip-flops 42a, 42b, ..., 42n are inputted to the decoder 43.

When a pulse Pin is inputted to the cascade-connected buffers 41a, 41b, ..., 41n in the delay measuring device thus constituted, the pulse is transmitted sequentially from one to the other. Then, when a pulse CK' used for measurement is inputted thereto after the elapse of a predetermined amount of time from the input of the pulse Pin, the flip-flops 42a, 42b, ..., 42n which are connected in parallel with the buffers arranged in a line latch output signals of the buffers 41a, 41b, ..., 41n at once. Assuming that the signals have been transmitted to the mth buffer when the signals are latched, "1" is shown in the outputs of the m number of flip-flops, while "0" is shown in the outputs of the (n−m) number of flip-flops. When these outputs are decoded by the decoder 43, outputs signals are generated, and delay amounts are accordingly determined.

In the delay measuring device shown in FIG. 7, wherein the clock in which the delay amount is reflected is outputted, however, it is necessary to numerically convert the clock using a frequency measuring device separately provided when the clock is actually used. Further, in the case where a plurality of delay measuring devices are provided in a semiconductor chip, each of the delay measuring devices has to be individually wired, which possibly increases a circuit area. Further, in the case where the ring oscillator is used, a clock having a particular frequency is continuously generated during the delay measurement, which easily causes a noise impact on peripheral circuits.

In the delay measuring device shown in FIG. 8, a plurality of flip-flops are necessary for the measurement of the delay amount at one position, which unfavorably increases an area of the delay measuring device itself.

SUMMARY OF THE INVENTION

Therefore, a main object of the present invention is to provide a delay measuring device having a small area in a semiconductor device and capable of reducing the generation of noise.

In order to achieve the foregoing object, a delay measuring device according to the present invention comprises a memory cell, having a non-inversion output terminal and an inversion output terminal, for fetching a data value inputted from outside in synchronization with a clock, retaining the fetched data value and outputting the retained data value from the non-inversion output terminal and the inversion output terminal;

a delay element connected to the inversion output terminal; and a selector for selecting one of the data value and a delayed data value outputted from the delay element and supplying the selected data value to the memory cell, wherein a comparison result of making a comparison between a delay amount generated in the delayed data value and a time length defined based on the clock is outputted from the non-inversion output terminal.

In the foregoing constitution, when the delayed data value by the delay element is selected based on the selection by the selector, the selected delayed data value is inputted to the memory cell. The delayed data value is an inverted data value. The delayed data value (inverted) is retained in the memory cell at a first timing t2 defined based on a waveform of the clock. The logic of the delayed data value (inverted) is inverted in the memory cell (in other words, becomes the non-inversion data value again) and outputted from the inversion output terminal. The outputted delayed data value (non-inversion) is further delayed by the delay element and supplied to the memory cell again via the selector at a second timing td defined in that delay process. The supplied delayed data value (non-inversion) is retained in the memory cell at a first timing t4 in the clock (another first timing behind the first timing t2 on a time axis in the clock) and outputted from the non-inversion output terminal of the memory cell. An example of the first timing is a waveform edge of the clock.

In the delay measuring device according to the present invention wherein the data is thus processed, a positional relationship between the first timing t4 and the second timing td on the time axis is variable depending on the delay amount in the delay element, and the respective timings are reversed timewise. The second timing td is earlier than the first timing t4 when the delay amount is relatively small, while the second timing td is later than the first timing t4 when the delay amount is relatively large.

In the case where the second timing td is earlier than the first timing t4 because the delay amount is relatively small, the data value subjected to the logic inversion at the second timing td is retained in the memory cell at the first timing t4, and the logic-inverted data value is outputted from the non-inversion output terminal. In the case where the second timing td is later than the first timing t4 because the delay amount is relatively large, the logic inversion to be implemented at the second timing td has not been implemented yet at the first timing t4 Therefore, the data value before the logic inversion is outputted from the non-inversion output terminal of the memory cell. Thus, the logic of the output value from the non-inversion output terminal of the memory cell changes depending on the delay amount in the delay element. In other words, the delay amount can be measured depending on the logic of the output value from the non-inversion output terminal of the memory cell.

According to the foregoing constitution, the delay measuring device has such a simple structure that comprises the memory cell, delay element and selector, which leads to the reduction of the area of the delay measuring device. Further, any noise can be prevented because such a continuous oscillation as in the ring oscillator is not generated.

The delay measuring device according to the present invention may be constituted such that a plurality of delay elements are provided and the selector selects an arbitrary delayed data value from a group of delayed data values outputted from the plurality of delay elements, and then selects one of the selected delayed data value and the data value and supplies the selected data value to the memory cells. Accordingly, the delay measurement can be performed based on the plurality of delay amounts different to each other, and the delay amount can be thereby measured with a high accuracy.

The delay measuring device according to the present invention may be constituted such that the plurality of delay elements are serially connected. According to the constitution, the delay amounts at a plurality of positions in the semiconductor device can be obtained in a simplified constitution The delay measuring device according to the present invention may further comprise a judger for judging the delay amount generated in the delayed data value based on the comparison result. Accordingly, it becomes unnecessary to measure the delay amount outside since the delay amount can be judged inside the delay measuring device. Therefore, the delay amount of the semiconductor device itself can be measured in the LSI alone.

The delay measuring device according to the present invention may cancel the supply of the output of the selector to the memory cell, and further comprise another selector for selecting one of the output of the selector and another data value and outputting the selected data value to the memory cell. Accordingly, the delay measuring device can be used as a memory cell (scan flip-flop) during an actual operation time, which is more effective in the area reduction.

In a semiconductor device according to the present invention, the delay measuring device according to the present invention thus constituted is provided at each of different circuit pattern positions, the plurality of delay measuring devices are serially connected, and the data value is inputted to the memory cells of the respective delay measuring devices in a shift operation.

According to the foregoing constitution, the delay amounts at a plurality of positions in the semiconductor device can be measured. Further, wiring lines used for the connection of the plurality of delay measuring devices can be thereby reduced.

The semiconductor device according to the present invention may be constituted such that at least one of the plurality of delay measuring devices is provided in the vicinity of a power supply terminal of the semiconductor device, and a controller for comparing the comparison result outputted from the non-inversion output terminal of the delay measuring device in the vicinity of the power supply terminal to the comparison result outputted from the non-inversion output terminal of another delay measuring device is further provided. When the controller thus compares the comparison result of the delay measuring device provided in the vicinity of the power supply terminal to the comparison result of another delay measuring device described above, the voltage drop in the vicinity of the delay measuring device provided in the vicinity of the power supply terminal can be estimated.

The semiconductor device according to the present invention may be constituted such that the controller investigates the comparison result outputted from the delay measuring device in the vicinity of the power supply terminal while a power supply voltage of the semiconductor device is being changed to thereby calculate a correlative relationship between the time length defined based on the clock and the power supply voltage. According to the foregoing constitution, the correlative relationship between the time length defined based on the clock and the power supply voltage is calculated, and then, the comparison result outputted from the non-inversion output terminal of the delay measuring device in the vicinity of the power supply terminal and the comparison result outputted from the non-inversion output terminal of another delay measuring device are compared to each other. As a result, the voltage drop in the vicinity of another delay measuring device described above can also be estimated.

The semiconductor device according to the present invention may further comprise:

a plurality of circuit blocks each having an identical function and provided with the delay measuring device as claimed in Claim 1, and a controller for allocating processing contents to be dealt with to the respective circuit blocks by comparing the comparison results outputted from the plurality of delay measuring devices to each other. According to the foregoing constitution, the delay amount in each of the circuit blocks is measured, and the processing contents are decided based on the measured delay amounts, so that the processing having a higher degree of importance is executed in the circuit block having more favorable characteristics. As a result, a higher processing quality can be obtained.

The semiconductor device according to the present invention may be constituted such that the circuit blocks are CPUs. Accordingly, a program having a higher degree of importance can be operated in the CPU having more favorable characteristics depending on the delay amounts measured in the delay measuring devices, which improves the processing quality.

The semiconductor device according to the present invention may be constituted such that the controller selects the circuit block to which a task having a higher degree of importance is allocated based on the comparison result obtained from a process in which the comparison results outputted from the plurality of delay measuring devices are further compared to each other. Accordingly, the processing quality can be improved with a simplified constitution based on the priority of the processing.

The semiconductor device according to the present invention may be constituted such that the circuit blocks each having the identical function are semiconductor memories, and the controller selects the circuit block in which storage data is to be stored based on the comparison result obtained from a process in which the comparison results outputted from the plurality of delay measuring devices are further compared to each other. According to the foregoing constitution wherein the circuit blocks (semiconductor memories) are switched depending on the measured delay amounts by the delay measuring devices and a degree of importance in the data to be stored, the processing quality can be thereby improved.

The semiconductor device according to the present invention may be constituted such that the delay element comprises a capacitor and a resistor, and the circuit blocks are dynamic memories. Accordingly, a data retention time in each of the dynamic memories is estimated and controlled based on the measurement of a speed at which charges stored in the capacitor decrease. As a result, the processing quality can be improved.

The semiconductor device according to the present invention may be constituted such that the controller selects an address space in which storage data is to be stored in the respective circuit blocks based on the comparison result obtained from a process in which the comparison results outputted from the plurality of delay measuring devices are further compared to each other. Accordingly, the measured delay amounts are read from addresses in a data bus connected to the semiconductor memories. As a result, it becomes unnecessary to provide wiring lines for exclusive use which reads the measured delay amounts, which controls the circuit area.

The semiconductor device according to the present invention may further comprise a controller for estimating the delay amount of the semiconductor device at an arbitrary circuit pattern position based on the comparison results outputted from the plurality of delay measuring devices located in the periphery of the arbitrary circuit pattern position. According to the foregoing constitution, the delay amount can be measured at any position where the delay measuring device is not provided.

According to the present invention the delay measuring device has such a simple structure that comprises the memory cell (flip-flop), delay element and selector, which leads to the reduction of the areas of the delay measuring device and the semiconductor device. Further, noise can be reduced because such a continuous oscillation as in the ring oscillator is not generated.

The present invention can be applied to a delay measuring device for evaluating characteristics of a semiconductor integrated circuit, and is particularly effective for a delay measuring device for analyzing IR drop in a semiconductor integrated circuit comprising a large-scale logic circuit.

BRIEF DESCRIPTION OF THE DRAWINGS

These and other objects as well as advantages of the invention will become clear by the following description of preferred embodiments of the invention and be specified in the claims attached hereto. A number of benefits not recited in this specification will come to the attention of the skilled in the art upon the implementation of the present invention.

FIG. 1 is a circuit diagram illustrating a constitution of a delay measuring device according to a preferred embodiment 1 of the present invention.

FIG. 7 is a circuit diagram illustrating a first constitution of a conventional delay measuring device.

DETAILED DESCRIPTION OF THE INVENTION

Figure 2:
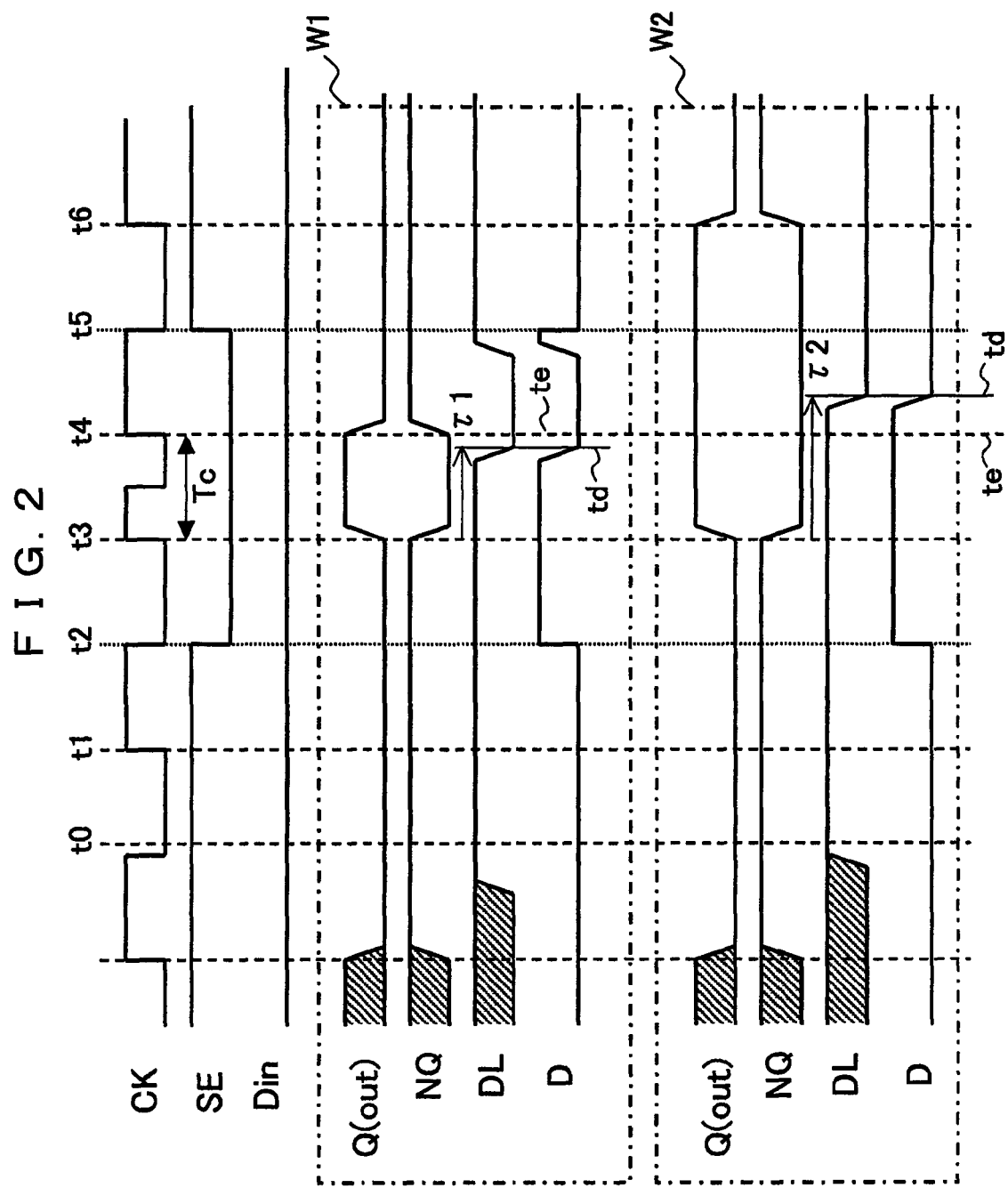
FIG. 2 is a timing chart of operations of the delay measuring device according to the preferred embodiment 1.

Hereinafter, preferred embodiments of the present invention are described referring to the drawings.

Preferred Embodiment 1

According to a preferred embodiment 1 of the present invention, data is inputted from outside, a flip-flop is set, an NQ output of the flip-flop delayed by a delay element is then fetched, and a clock pulse is thereafter inputted to the flip-flop twice. As a result, a delay amount is measured.

Details of the preferred embodiment 1 are described below. FIG. 1 is a circuit diagram illustrating a constitution of a delay measuring device A according to the preferred embodiment 1. The delay measuring device A is provided in a semiconductor integrated circuit, and comprises a flip-flop 1 as a memory cell for fetching a data value inputted to the delay measuring device A in a data input (D) (hereinafter, referred to as input data value) based on a timing defined by a waveform of a clock CK (an edge is used in the present preferred embodiment) and retaining the fetched data value, a delay element 2 connected to an inversion output terminal NQ of the flip-flop 1, a selector 3 for selecting one of an input data value Din and an output data value DL of the delay element 2 and outputting the selected data value to the data input (D) of the flip-flop 1, and a measurement result output terminal O1 connected to a non-inversion output terminal Q of the flip-flop 1. The non-inversion output terminal Q outputs a comparison result of making a comparison between a delay amount generated in a delayed data value and a time length defined based on the clock, via the measurement result output terminal 01. I1 denotes a data input terminal to which the input data value Din is inputted from outside. I2 denotes a selection signal input terminal to which a selection signal SE for controlling the switching of the selector 3 is inputted. I3 denotes a clock input terminal to which the clock CK is inputted from outside.

The selector 3 selects the input data value Din when the selection signal SE shows "1", while selecting the delayed data value DL from the delay element 2 when the selection signal SE shows "0". When the selection signal SE of the selector 3 shows "1", the input data value Din is inputted to the flip-flop 1. The flip-flop 1 fetches the input data value Din at the rising edges of the clock CK. When the selection signal SE of the selector 3 shows "0", the delayed data value DL is inputted to the flip-flop 1. The flip-flop 1 fetches the delayed data value DL at the rising edges of the clock CK. The value outputted from the measurement result output terminal O1 is judged at predetermined timings so that the delay amount is measured.

Next, the operation of the delay measuring device according to the present preferred embodiment thus constituted is described referring to a timing chart shown in FIG. 2. W1 denotes an operation waveform shown in the case where a delay amount τ1 of the delay element 2 is relatively small, and W2 denotes an operation waveform shown in the case where a delay amount τ2 of the delay element 2 is relatively large.

First, the input data value Din shows the value of "0" in the vicinity of a timing t0. The data input (D) of the flip-flop 1 shows "0", the non-inversion output terminal Q shows "0", the inversion output terminal NQ shows "1", and the delayed data value DL shows "1". In this state, the selection signal SE shows "1", and the input data value Din (="0") is selected in the flip-flop 1 based on the value of the selection signal SE. Therefore, the input data value Din (="0") is inputted to the data input (D) of the flip-flop 1. At a timing t1 defined by one of the rising edges of the clock waveform in the clock CK, the input data value Din (="0") is fetched into the flip-flop 1. At the timing t1, the value of the non-inversion output terminal Q is "0", the value of the inversion output terminal NQ is "1", and the value of the delayed data value DL is "1".

When the value of the selection signal SE, which is "1", is inverted to "0" at a timing t2 defined by the trailing edge subsequent to the rising edge of the timing t1, the selector 3 selects the delayed data value DL (="1"). As a result, the delayed data value DL (="1") is inputted to the data input (D) of the flip-flop 1.

At a timing t3 defined by the rising edge subsequent to the trailing edge of the timing t2, the delayed data value DL (="1") is fetched into the flip-flop 1. At the time, the value of the non-inversion output terminal Q, which is "0", is inverted to "1", and the value of the inversion output terminal NQ, which is "1", is inverted to "0".

The inversion from "1" to "0" in the inversion output terminal NQ is delayed by the delay element 2. Therefore, at a timing td defined by the delay amount of the delay element 2, the delayed data value DL, which is "1", is inverted to "0". Hereinafter, the timing td is called a polarity inversion timing. The output of the delay element 2 is the delayed data value DL, and the polarity inversion timing td of the delayed data value DL shifts forward or backward in terms of time in accordance with varying changes in the delay amounts τ1 and τ2 in the delay element 2. The polarity inversion timing td is relatively forward on a time axis in the mode W1 in which the delay amount τ1 is relatively small, while the polarity inversion timing td is relatively backward on the time axis in the mode W2 in which the delay amount τ2 is relatively large.

Then, a temporal position of a timing t4 defined at the rising edge subsequent to the rising edge of the timing edge t3 is adjusted as follows. A cycle of the clock CK during a period between the timings t3 and t4 is adjusted so that the timing t4 is temporally positioned between the polarity inversion timing td defined based on the delay amount τ1 and the polarity inversion timing td defined based on the delay amount τ2. The cycle of the clock CK at this time is a period shorter than an ordinary clock cycle (a period between the timing t1 which is a timing of the data being input to the flip-flop 1 and the timing t3 which is a timing of the data being output from the flip-flop 1).

At the timing t4, the flip-flop 1 fetches the data value into the data input (D) thereof again. Hereinafter, the timing t4 is referred to as a re-fetching timing te. In the present preferred embodiment, the status of the delayed data value DL selected by the selector 3 at the time is important. Below is given a description.

In the mode W1 in which the delay amount τ1 is small, the delayed data value DL has already been inverted by the timing t4 (=re-fetching timing te), and the value thereof is "0". Therefore, the non-inversion output terminal Q of the flip-flop 1 is inverted from "1" to "0".

In the mode W2 in which the delay amount τ2 is large, the delayed data value DL has not yet been inverted by the timing t4 (=re-fetching timing te) and the value thereof still remains "1". Therefore, the non-inversion output terminal Q of the flip-flop 1 continuously retains "1".

Thus, the logic outputted from the non-inversion output terminal Q of the flip-flop 1 changes depending on the delay amounts τ1 and τ2 in the delay element 2. The logic is the comparison result showing the comparison between the delay amount generated in the delayed data value and the time length defined based on the clock. When the logic is thus judged, the delay amounts τ1 and τ2 in the delay element 2 can be measured. Further, the delay amounts τ in the delay element 2 can be measured with a high accuracy when the time length between the timings t3 and t4 (=cycle Tc) is adjusted.

At a timing t5 defined by the trailing edge subsequent to the rising edge of the timing t4, the value of the selection signal SE is returned to "1". At a timing t6 defined by the rising edge subsequent to the trailing edge of the timing t5, the delay measuring device A is initialized.

According to the present preferred embodiment, the flip-flop 1, delay element 2 and selector 3 can easily constitute the delay measuring device A, and the area of the delay measuring device A can be thereby controlled. Further such a continuous oscillation as in the conventional ring oscillator does not occur, which controls the generation of any noise.

Preferred Embodiment 2

Figure 3:
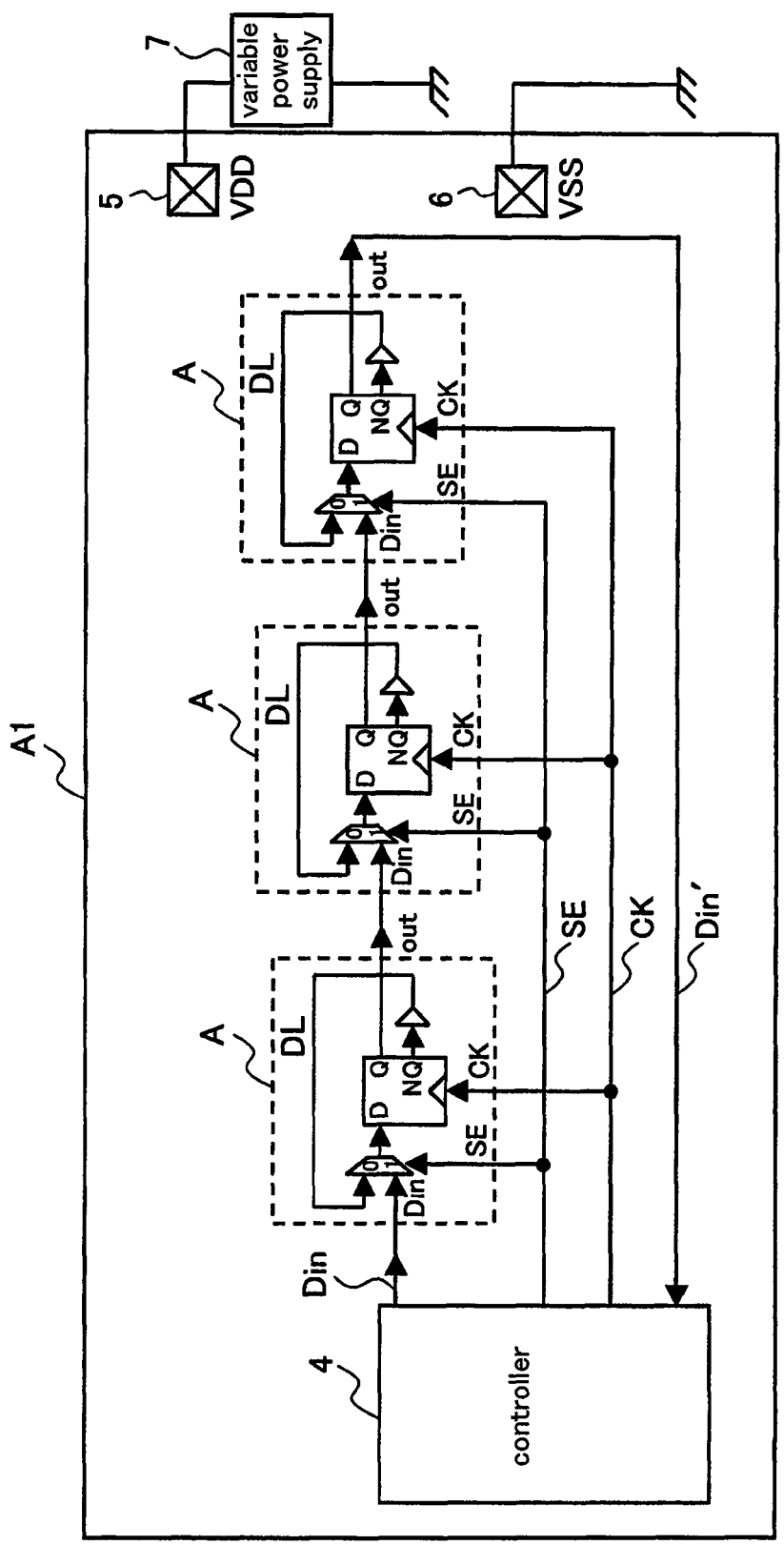
FIG. 3 is a circuit diagram illustrating a constitution of a delay measuring device according to a preferred embodiment 2 of the present invention.

In a preferred embodiment 2 of the present invention, a plurality of delay measuring devices A constituted as described in the preferred embodiment 1 are connected, and the delay amounts at a plurality of positions are thereby measured. FIG. 3 is a circuit diagram illustrating a constitution of a delay measuring device A1 according to the preferred embodiment 2. Each of three delay measuring devices A, A, and A is constituted in the same manner as the delay measuring device according to the preferred embodiment 1, and an output of the delay measuring device A in the former stage is serially connected to an input of the subsequent delay measuring device A. A reference numeral 4 denotes a controller for comparing a comparison result outputted from a non-inversion output terminal of the delay measuring device in the vicinity of a power supply terminal to a comparison result outputted from a non-inversion output terminal of one of the other delay measuring devices. 5 denotes a VDD terminal, 6 denotes a VSS terminal, and 7 denotes a variable power supply.

The common clock CK and selection signal SE are supplied from the controller 4 to the three delay measuring devices A. An input data value Din of the top delay measuring device A is outputted from the controller 4, and an output data value Din' of the rearmost delay measuring device A is inputted to the controller 4. The rearmost delay measuring device A is provided in the vicinity of the VDD terminal 5 and the VSS terminal 6.

Next, the operation of the delay measuring device A1 according to the present preferred embodiment is described. The controller 4 outputs an initial value as the input data value Din. Then, the controller A sets the selection signal SE to "1" so that the selector 3 selects the input data value Din. Further, the controller 4 supplies pulse waveforms of the clocks CK as many as the delay measuring devices A to respective delay measuring devices A, and the initial value is thereby set in flip-flops 1 of all of the delay measuring devices A. Below is given a description based on the constitution comprising the three delay measuring devices A shown in the drawing. In the description below, the delay measuring device A closest to the controller 4 is called a first delay measuring device A, and the other delay measuring devices are respectively called second and third delay measuring devices A in increasing order of a distance from the controller A. When a first pulse waveform is supplied to the first-third delay measuring devices A, the initial value is set in the flip-flop 1 of the first delay measuring device A. When a second pulse waveform is supplied to the first-third delay measuring devices A, the initial value is set in the flip-flops 1 of the first and second delay measuring devices A. When a third pulse waveform is supplied to the first-third delay measuring devices A, the initial value is set in the flip-flops 1 of the first-third delay measuring devices A.

Next, the controller 4 sets the selection signal SE to "0" so that the delayed data values DL by delay elements 2 are selected. Further, the controller 4 outputs and supplies two rising edges to the respective delay measuring devices A during a period when the "0" is set in the selection signal SE. An interval between the two rising edges is Tc.

Next, the controller 4 sets the selection signal SE to "1" so that the selectors 3 of the respective delay measuring devices A select the input data value Din. Then, the controller 4 supplies the pulse waveforms of the clocks CK as many as the number of the delay measuring devices A to the respective delay measuring devices A. The delay measuring devices A which received the pulse waveforms respectively output the measurement results (comparison results) stored in the flip-flops 1 as the output data value Din'. Below is given a description. In the description below, the delay measuring device A closest to the controller 4 is called the first delay measuring device A, and the other delay measuring devices are respectively called the second and third delay measuring devices A in the same manner as in the description given earlier. When the first pulse waveform is supplied to the first-third delay measuring devices A, the flip-flop 1 of the first delay measuring device A outputs the measurement result stored in the first delay measuring device A as the output data value Din'. When the second pulse waveform is supplied to the first-third delay measuring devices A, the flip-flop 1 of the second delay measuring device A outputs the measurement results stored in the first and second delay measuring devices A as the output data value Din'. When the third pulse waveform is supplied to the first-third delay measuring devices A, the flip-flop 1 of the third delay measuring device A outputs the measurement results stored in the first-third delay measuring devices A as the output data value Din'. The measurement results stored in the first-third delay measuring devices A which are outputted from the flip-flop 1 of the third delay measuring device A as the output data value Din' are shifted timewise in the output data value Din' in accordance with the cycle of the clock CK at the time.

The controller 4 receives the output data value Din' outputted from the flip-flop 1 of the third delay measuring device A, and budges if the measurement results (comparison results=delay amounts τ) in the respective delay measuring devices A are longer or shorter in terms of time than the cycle Tc previously set based on the received measurement results. In the present preferred embodiment, the delay value is measured as described while the cycle Tc is variously changed. As a result, the delay amounts τ can be very accurately measured.

According to the present preferred embodiment wherein the plurality of delay measuring devices are connected with fewer wiring lines, the delay amount can be measured at a plurality of positions in the semiconductor device with such a simplified constitution. Further, the controller 4 functioning as a judger for judging the data values retained in the plurality of flip-flops 1 is provided inside, which makes it unnecessary to perform the measurement outside. As a result, the delay amount of the semiconductor device itself can be measured in the LSI alone.

FIG. 3 shows the example in which the three delay measuring devices A are provided. However, the number of the delay measuring device can be increased, and the number of the measuring positions can be accordingly increased. Further, the voltage drop resulting from the IR drop in the vicinity of the plurality of delay measuring devices A can be estimated according to the following method. The cycle Tc of the clock CK at the time of the measurement is changed by the controller 4 while a power supply voltage supplied by the variable power supply 7 to the rearmost delay measuring device A provided in the vicinity of the VDD terminal 5 and the VSS terminal 6 is changed at the same time, so that a correlative relationship between the power supply voltage and the cycle Tc is checked. Then, the power supply voltage is set to a constant level, and the delay amounts τ of the top and next delay measuring devices A are measured. As a result, the voltage drop resulting from the IR drop can be estimated.

Preferred Embodiment 3

Figure 4:
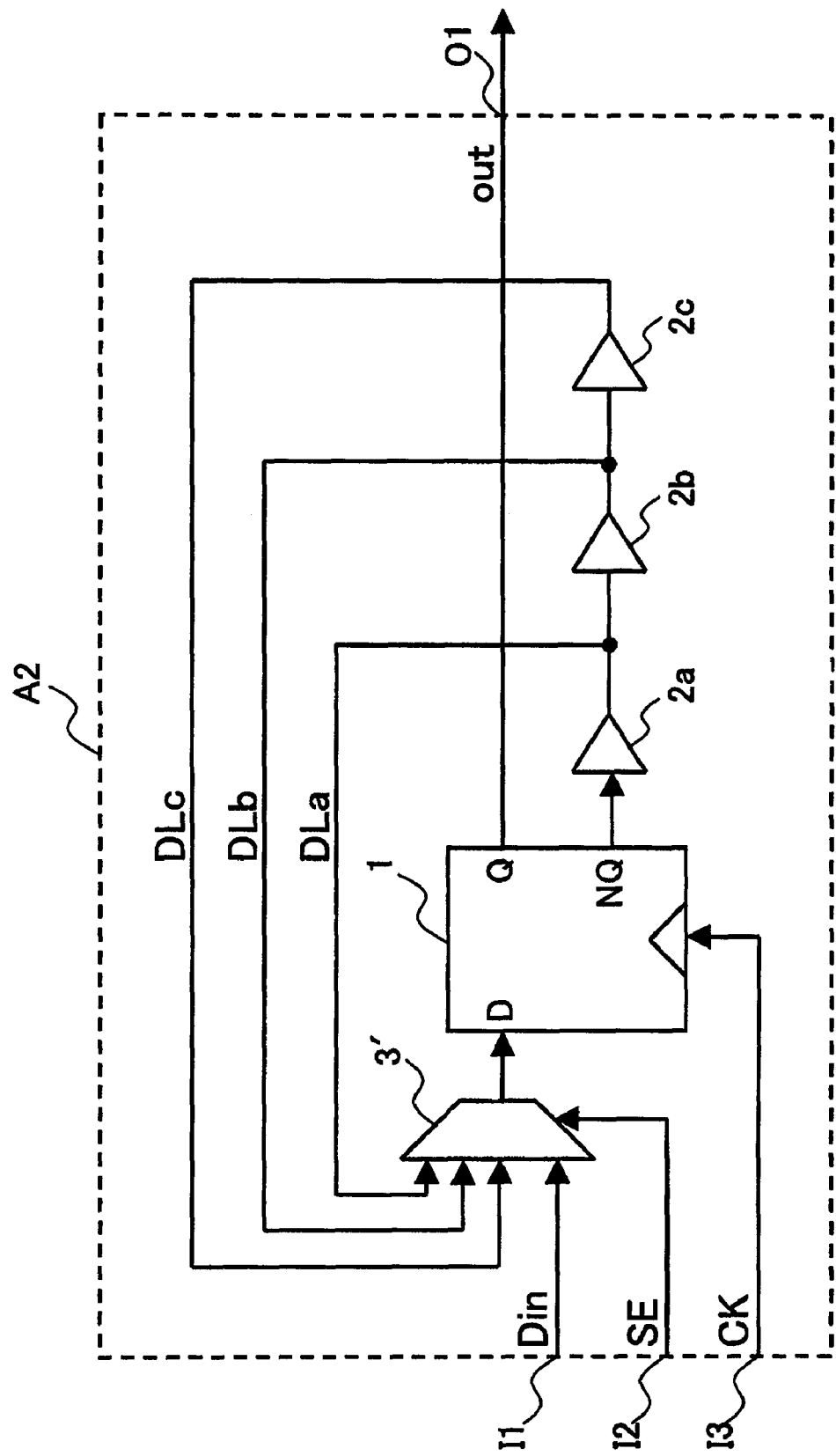
FIG. 4 is a circuit diagram illustrating a constitution of a delay measuring device according to a preferred embodiment 3 of the present invention.

In a preferred embodiment 3 of the present invention, the number of the delay element 2 to be provided in the delay measuring device A according to the preferred embodiment 1 is increased, and the delay measurement is performed based on two or more pieces of delay information thereby obtained. FIG. 4 is a circuit diagram illustrating a constitution of a delay measuring device A2 according to the preferred embodiment 3. The same reference numerals shown in FIG. 4 as those shown in FIG. 1 for the preferred embodiment 1, denote the same components. The delay measuring device A2 according to the present preferred embodiment comprises three delay elements 2a, 2b and 2c serially provided and connected to the inversion output terminal NQ of the flip-flop 1, and a selector 3' for selecting one of delayed data values DLa, DLb and DLc of the three delay elements 2a, 2b and 2c and supplying the selected delayed data value to the flip-flop 1.

The selector 3' selects one of the delayed data values DLa, DLb and DLc of the three delay elements 2a, 2b and 2c depending on the value of the selection signal SE and supplies the selected delayed data value to the data input (D) of the flip-flop 1.

According to the present preferred embodiment, the delay amount is measured based on the delayed data values DLa, DLb and DLc different to one another, without changing the cycle Tc of the clock CK inputted when the data value is fetched into the flip-flop 1. As a result, the delay amount can be measured with a higher accuracy.

In the foregoing description, the three delay elements are used. When the number of the delay elements is further increased, the delay amount can be measured in a more detailed manner. Further, the delay measuring device A2 according to the present preferred embodiment can be applied to the preferred embodiment 2 shown in FIG. 3.

Preferred Embodiment 4

Figure 5:
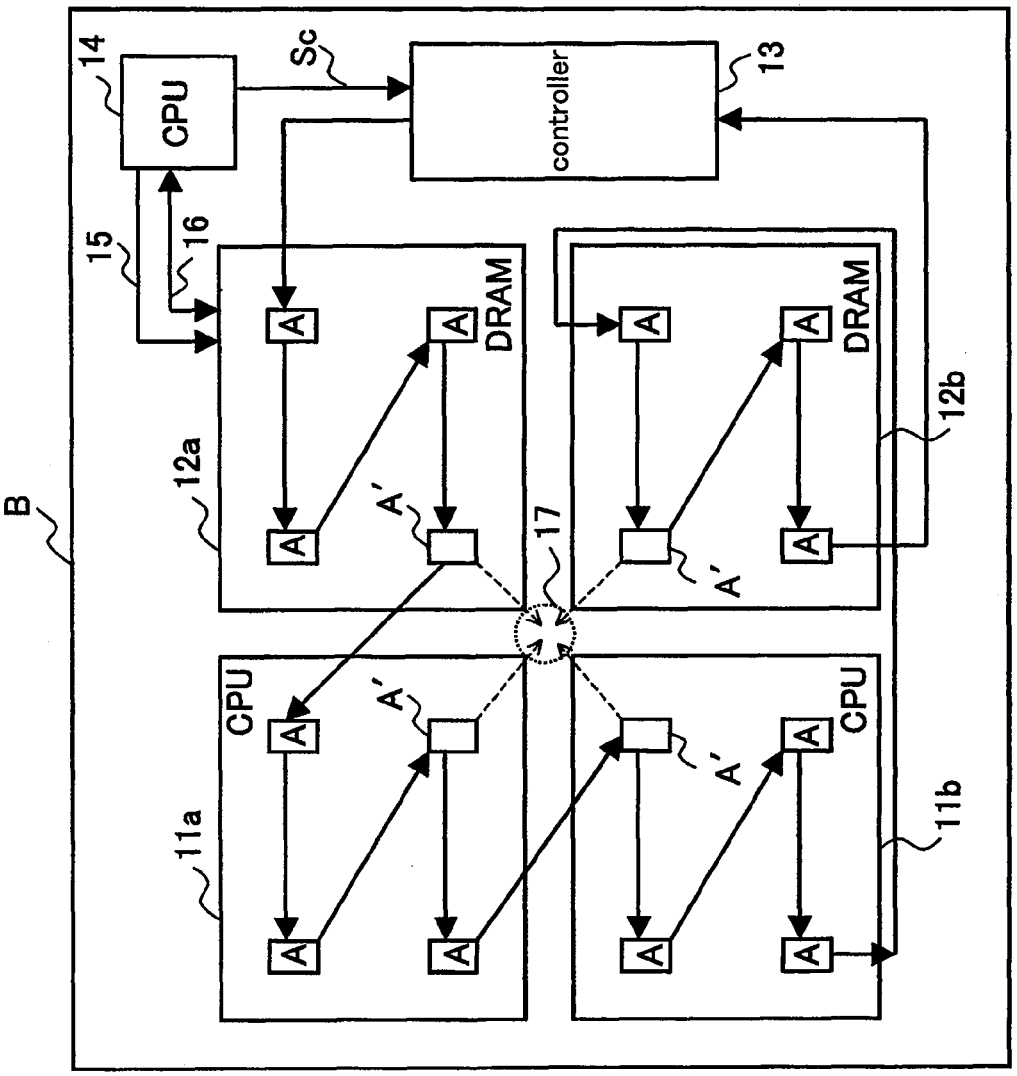
FIG. 5 is a circuit diagram illustrating a constitution of a semiconductor device according to a preferred embodiment 4 of the present invention.

A preferred embodiment 4 of the present invention relates to a semiconductor device provided with circuit blocks each provided with a delay measuring device and having an identical function. FIG. 5 is a circuit diagram illustrating a constitution of a semiconductor device B according to the preferred embodiment 4. Referring to reference numerals shown in FIGS. 5, 11a and 11b each denote a CPU provided with the delay measuring devices A according to the preferred embodiment 1, 12a and 12b each denote a DRAM provided with the delay measuring devices A, 13 denotes a controller, 14 denotes a CPU, 15 denotes an address bus, and 16 denotes a data bus.

The semiconductor device B comprises the CPUs 11a and 11b and the DRAMs 12a and 12b. The CPUs 11a and 11b have an identical function, and the DRAMs 12a and 12b also have an identical function. The CPUs 11a and 11b and the DRAMs 12a and 12b each comprise the delay measuring devices A. The plurality of delay measuring devices A are serially connected to one another apart from the CPUs 11a and 11b and the DRAMs 12a and 12b. The plurality of delay measuring devices A are controlled by a controller 13.

The controller 13 continuously observes measurement results of the delay measuring devices A in the CPUs 11a and 11b having the identical function (comparison results obtained from a process in which the delay amount generated in the delayed data value and the time length defined based on the clock are compared to each other, which denote the delay amounts). When any difference between the delay amounts in the CPUs 11a and 11b is confirmed as a result of the observation, the controller 13 allocates processing having a higher degree of importance to the circuit block which is more stable (CPU) based on the observation result. Accordingly, the processing can be implemented in a stable operation.

The controller 13 also continuously observes the measurement results of the delay measuring devices A in the DRAMs 12a and 12b having the identical function (comparison results described above, which denote delay amounts). When any difference between the delay amounts in the DRAMs 12a and 12b is confirmed as a result of the observation, the controller 13 allocates processing having a higher degree of importance to the circuit block which is more stable (DRAM) based on the observation result. Accordingly, the processing can be implemented in a stable operation.

Regarding the DRAMs 12a and 12b, a refresh interval may be controlled based on the measured delay amounts. The DRAM 12a is connected to the CPU 14 via the address bus 15 and the data bus 16. The CPU 14 reads the measurement results (delay amounts) of the delay measuring devices A using the address bus 15 and the data bus 16, and controls the controller 13 based on the read measurement results. The controller 13 is controlled at the time by a control signal Sc. The delay amount of a measurement position 17 where the controller is absent can be estimated based on the delay amounts of a plurality of delay measuring devices A' in the vicinity thereof.

According to the present preferred embodiment, in the semiconductor device provided with the plurality of circuit blocks having the identical function, the measurement results of the plurality of delay measuring devices in the respective circuit blocks are compared to each other, and the processing contents for the respective circuit blocks are selected. Accordingly, the processing having a higher degree of importance can be executed in the circuit block having more favorable characteristics, which increases a processing quality. In the case where the circuit block is the CPU, a program having a higher degree of importance can be operated in the CPU having more favorable characteristics. The CPU in charge of the processing is changed depending on the measured delay value and a degree of importance of a task, and the processing quality can be improved in such a simplified manner that the priority of the processing is used. In the case where the circuit block is the DRAM, a region where data is stored is changed depending on the measured delay amount and the data contents to be stored, and the processing quality can be improved, with due consideration given to the degree of importance of the data.

Preferred Embodiment 5

Figure 6:
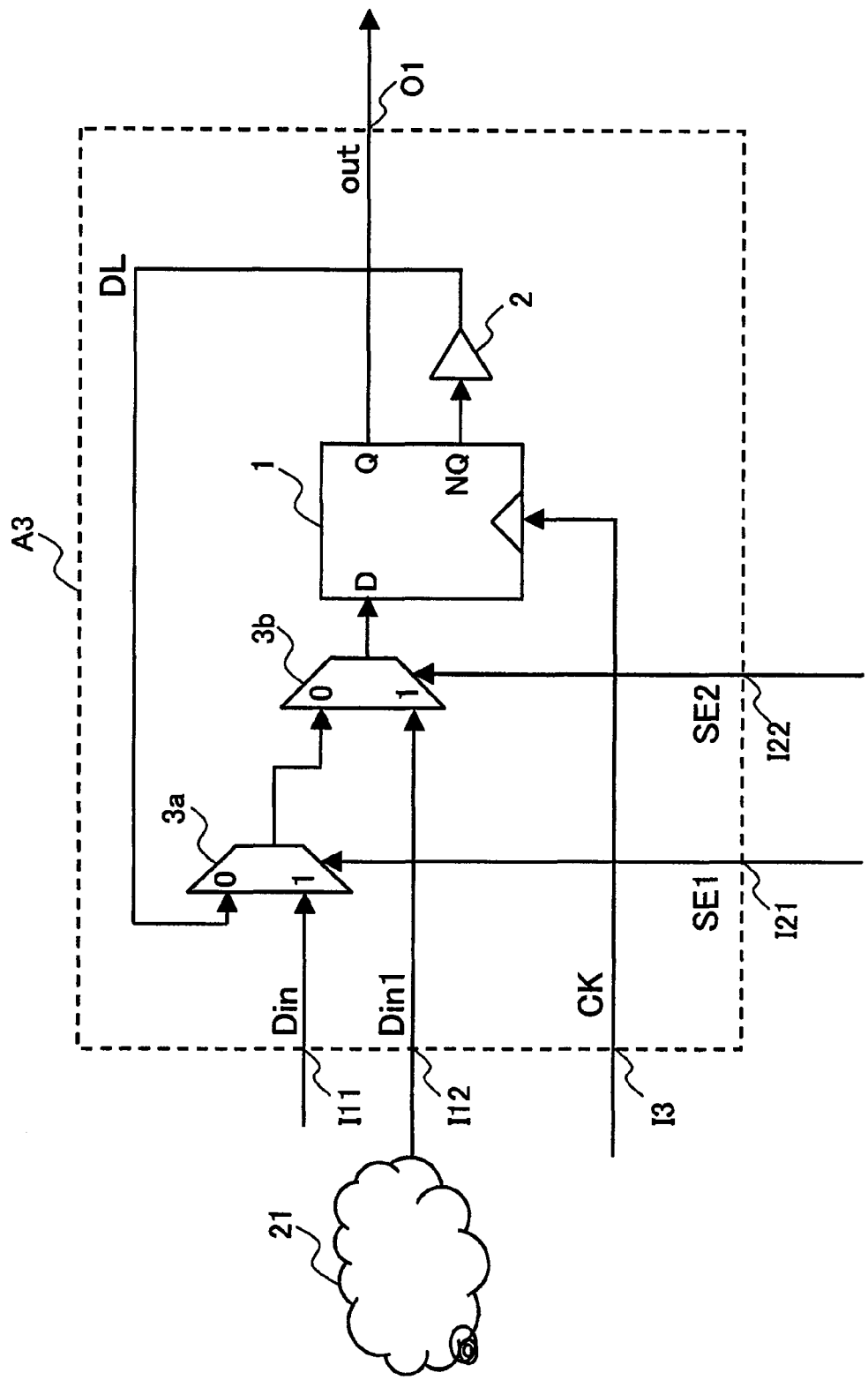
FIG. 6 is a circuit diagram illustrating a constitution of a delay measuring device according to a preferred embodiment 5 of the present invention.
Figure 8:
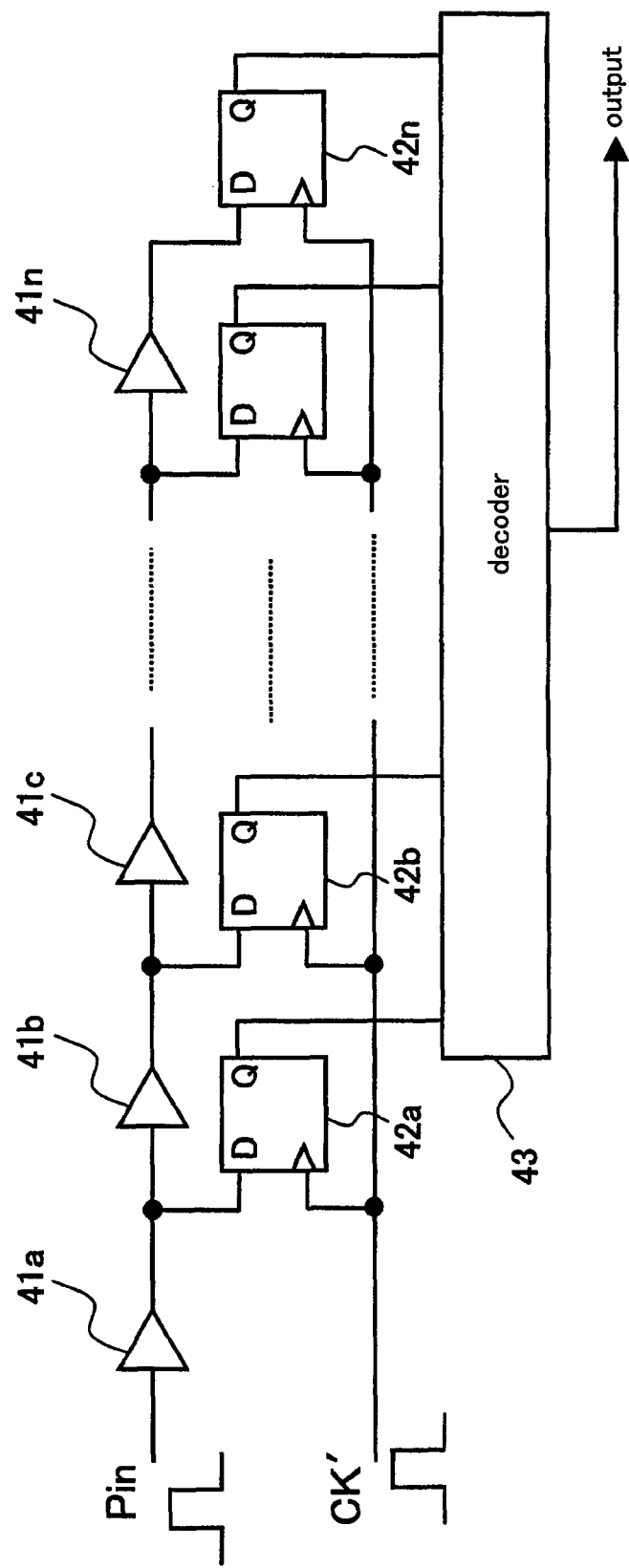
FIG. 8 is a circuit diagram illustrating a second constitution of the conventional delay measuring device.

In a preferred embodiment 5 of the present invention, a second selector is additionally provided in the delay measuring device according to the preferred embodiment 1 so that the delay measuring device can be used as a scan flip-flop in an actual operation circuit. FIG. 6 is a circuit diagram illustrating a constitution of a delay measuring device A3 according to the preferred embodiment 5. The delay measuring device A3 is further provided with a second selector 3b in the constitution shown in FIG. 1. The selector 3 originally provided is called a first selector 3a. The second selector 3b is inserted between the first selector 3a and the flip-flop 1. The first selector 3a selects one of the input data value Din and the delayed data value DL based on a first selection signal SE1 from a selection signal input terminal I21, and outputs the selection result to the second selector 3b. The second selector 3b selects one of an input data value Din1 from a random logic 21 and an output data value from the first selector 3a based on a second selection signal SE2 from a selection signal input terminal 122, and outputs the selected data value to the data input (D) of the flip-flop 1.

According to the present preferred embodiment wherein the second selector 3b is further provided, not only the delay measuring device A3 can be used for the measurement of the delay amount, but also the delay measuring device A3 can be incorporated in the circuit during an actual operation time and used as the scan flip-flop, which is effective for the area reduction.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A delay measuring device comprising:
 a memory cell, having a non-inversion output terminal and an inversion output terminal, for fetching a data value inputted from outside in synchronization with a clock, retaining the fetched data value and outputting the retained data value from the non-inversion output terminal and the inversion output terminal;
 a delay element connected to the inversion output terminal; and
 a selector for selecting one of the data value and a delayed data value outputted from the delay element and supplying the selected data value to the memory cell, wherein
 a comparison result of making a comparison between a delay amount generated in the delayed data value and a time length defined based on the clock is outputted from the non-inversion output terminal.

2. The delay measuring device as claimed in claim 1, wherein
 a plurality of delay elements are provided, and
 the selector selects an arbitrary delayed data value from a group of delayed data values outputted from the plurality of delay elements, and then selects one of the selected delayed data value and the data value and supplies the selected data value to the memory cells.

3. The delay measuring device as claimed in claim 2, wherein
 the plurality of delay elements are serially connected.

4. The delay measuring device as claimed in claim 1, further comprising a judger for judging the delay amount generated in the delayed data value based on the comparison result.

5. The delay measuring device as claimed in claim 1 while canceling the supply of the output of the selector to the memory cell, further comprising another selector for selecting one of the output of the selector and another data value and outputting the selected data value to the memory cell.

6. A semiconductor device provided with the delay measuring as claimed claim 1 at each of different circuit pattern positions therein, wherein
the plurality of delay measuring devices are serially connected, and
the data value is inputted to the memory cell of the respective delay measuring devices in a shift operation.

7. The semiconductor device as claimed in claim 6, wherein
at least one of the plurality of delay measuring devices is provided in the vicinity of a power supply terminal of the semiconductor device, and
a controller for comparing the comparison result outputted from the non-inversion output terminal of the delay measuring device in the vicinity of the power supply terminal to the comparison result outputted from the non-inversion output terminal of another delay measuring device previously described is further provided.

8. The semiconductor device as claimed in claim 7, wherein
the controller investigates the comparison result outputted from the delay measuring device in the vicinity of the power supply terminal while changing a power supply voltage of the semiconductor device to thereby calculate a correlative relationship between the time length defined based on the clock and the power supply voltage.

9. The semiconductor device as claimed in claim 6, further comprising a controller for estimating the delay amount of the semiconductor device at an arbitrary circuit pattern position based on the comparison results outputted from the plurality of delay measuring devices located in the periphery of the arbitrary circuit pattern position.

10. A semiconductor device comprising:
a plurality of circuit blocks each having an identical function and provided with the delay measuring device as claimed in claim 1; and
a controller for allocating processing contents to be dealt with to the respective circuit blocks by comparing the comparison results outputted from the plurality of delay measuring devices to each other.

11. The semiconductor device as claimed in claim 10, wherein
the circuit blocks are CPUs.

12. The semiconductor device as claimed in claim 11, wherein
the controller selects the circuit block to which a task having a higher degree of importance is allocated based on the comparison result obtained from a process in which the comparison results outputted from the plurality of delay measuring devices are further compared to each other.

13. The semiconductor device as claimed in claim 10, wherein
the circuit blocks each having the identical function are semiconductor memories, and
the controller selects the circuit block in which storage data is to be stored based on the comparison result obtained from a process in which the comparison results outputted from the plurality of delay measuring devices are further compared to each other.

14. The semiconductor device as claimed in claim 13, wherein
the delay element comprises a capacitor and a resistor, and the circuit blocks are dynamic memories.

15. The semiconductor device as claimed in claim 13, wherein
the controller selects an address space in which storage data is to be stored in the respective circuit blocks based on the comparison result obtained from a process in which the comparison results outputted from the plurality of delay measuring devices are further compared to each other.

* * * * *